(12) United States Patent
Tokunaga

(10) Patent No.: US 8,319,226 B2
(45) Date of Patent: Nov. 27, 2012

(54) THIN FILM TRANSISTOR AND DISPLAY DEVICE

(75) Inventor: Kazuhiko Tokunaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 157 days.

(21) Appl. No.: 12/619,299

(22) Filed: Nov. 16, 2009

(65) Prior Publication Data

US 2010/0123131 A1  May 20, 2010

(30) Foreign Application Priority Data

Nov. 17, 2008  (JP) ................................. 2008-293043

(51) Int. Cl.
*H01L 27/14* (2006.01)
(52) U.S. Cl. ............................. 257/72; 257/59; 257/258
(58) Field of Classification Search .................... 257/59, 257/72, 258
See application file for complete search history.

(56) References Cited

U.S. PATENT DOCUMENTS

| | | | | |
|---|---|---|---|---|
| 2002/0135709 A1* | 9/2002 | Sung Chae et al. | ............ | 349/43 |
| 2005/0122443 A1* | 6/2005 | Kim et al. | ........................ | 349/46 |
| 2007/0072439 A1* | 3/2007 | Akimoto et al. | ............ | 438/795 |
| 2008/0315200 A1* | 12/2008 | Kim et al. | ........................ | 257/57 |

FOREIGN PATENT DOCUMENTS

| | | |
|---|---|---|
| JP | 2000-002892 A | 1/2000 |
| JP | 2002-076356 A | 3/2002 |
| JP | 2004-071920 A | 3/2004 |
| JP | 2007-123861 | 5/2007 |
| JP | 2007-134496 A | 5/2007 |
| JP | 2008-235871 A | 10/2008 |
| JP | 2009-141002 A | 6/2009 |

OTHER PUBLICATIONS

Japanese Patent Office, Office Action issued in Patent Application JP 2008-293043, on Nov. 24, 2010.
Japanese Office Action issued on Sep. 8, 2011 in connection with counterpart JP Application No. 2008-293043.

* cited by examiner

*Primary Examiner* — Tan N Tran
(74) *Attorney, Agent, or Firm* — SNR Denton US LLP

(57) ABSTRACT

The present invention provides a thin film transistor realizing improved reliability by suppressing deterioration in electric characteristics. The thin film transistor includes an oxide semiconductor film forming a channel; a gate electrode disposed on one side of the oxide semiconductor film via a gate insulating film; and a pair of electrodes formed as a source electrode and a drain electrode in contact with the oxide semiconductor film and obtained by stacking at least first and second metal layers in order from the side of the oxide semiconductor film The first metal layer is made of a metal having ionization energy equal to or higher than molybdenum (Mo), a metal having oxygen barrier property, or a nitride or a silicon nitride of the metal having oxygen barrier property.

9 Claims, 8 Drawing Sheets

THIN FILM TRANSISTOR AND DISPLAY DEVICE

BACKGROUND OF THE INVENTION

1. Field of the Invention

The present invention relates to a thin film transistor using an oxide semiconductor film and a display device using the same.

2. Description of the Related Art

In recent years, attention is being paid to a thin film transistor (TFT) using a semiconductor whose main component is an oxide (hereinbelow, called oxide semiconductor) for an active layer. It is known that the electron mobility of the oxide semiconductor is higher than that of amorphous silicon (α-Si) generally used for a liquid crystal display or the like, and the oxide semiconductor has excellent electric characteristics. As such oxide semiconductors, an oxide semiconductor whose main component is zinc oxide (ZnO) (refer to Patent document 1: Japanese Unexamined Patent Application Publication No. 2002-76356), an oxide semiconductor whose main component is In—M—Zn—O (M denotes at least one of gallium (Ga), aluminum (Al), and iron (Fe) (refer to Patent document 2: Japanese Unexamined Patent Application Publication No. 2007-134496), and the like are proposed. In a thin film transistor of the patent document 2, by making a source electrode and a drain electrode formed on the oxide semiconductor, of a metal having a specific work function, a high on/off ratio is realized.

SUMMARY OF THE INVENTION

In such an oxide semiconductor, however, oxygen is desorbed with time in manufacture, operation, and the like and, due to this, a current-voltage characteristic of a thin film transistor deteriorates. It causes deterioration in reliability.

It is therefore desirable to provide a thin film transistor realizing improved reliability by suppressing deterioration in electric characteristics and a display device using the same.

According to an embodiment of the present invention, there is provided a thin film transistor including: an oxide semiconductor film forming a channel; a gate electrode disposed on one side of the oxide semiconductor film via a gate insulating film; and a pair of electrodes formed as a source electrode and a drain electrode in contact with the oxide semiconductor film and obtained by stacking each of first and second metal layers in order from the side of the oxide semiconductor film. The first metal layer is made of a metal having ionization energy equal to or higher than molybdenum (Mo), a metal having oxygen barrier property, or a nitride or a silicon nitride of the metal having oxygen barrier property.

In the thin film transistor of the embodiment of the present invention, a pair of electrodes which are in contact with the oxide semiconductor film are obtained by stacking the first and second metal layers, and the first metal layer which is in contact with the oxide semiconductor film is made of a metal having ionization energy equal to or higher than that of molybdenum, that is, a metal which is not susceptible to oxidation. If the metal layer which is in contact with the oxide semiconductor film is made of a metal having ionization energy lower than that of molybdenum, that is, a metal which is susceptible to oxidation, oxygen in the oxide semiconductor film is easily taken to the side of the metal layer with oxidation of the metal layer. Consequently, if the metal susceptible to oxidation is in contact with the oxide semiconductor film, oxygen in the oxide semiconductor film is desorbed and loss occurs. Due to this, carriers are easily generated. Therefore, by making the first metal layer in contact with the oxide semiconductor film of a metal which is not susceptible to oxidation, generation of carriers due to loss of oxygen in the oxide semiconductor film is suppressed.

Alternatively, by making the first metal layer of a metal having oxygen barrier property, or a nitride or a silicon nitride of the metal having oxygen barrier property, desorption of oxygen in the oxide semiconductor film to the outside may be suppressed. Therefore, like in the case where the first metal layer is made of a metal having predetermined ionization energy, generation of carriers in the oxide semiconductor film is suppressed.

According to an embodiment of the present invention, there is provided a display device including a display element and the thin film transistor of an embodiment of the present invention.

In the thin film transistor and the display device of the embodiment of the present invention, a pair of electrodes in contact with the oxide semiconductor film has a stack structure, and the first metal layer on the side of the oxide semiconductor film is made of a metal having ionization energy equal to or higher than that of molybdenum, a metal having oxygen barrier property, or a nitride or a silicon nitride of the metal having oxygen barrier property. Consequently, generation of carriers due to desorption of oxygen may be suppressed. Thus, deterioration in the electric characteristics is suppressed, and the reliability may be improved.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

Configuration of Thin Film Transistor

Figure 1A:
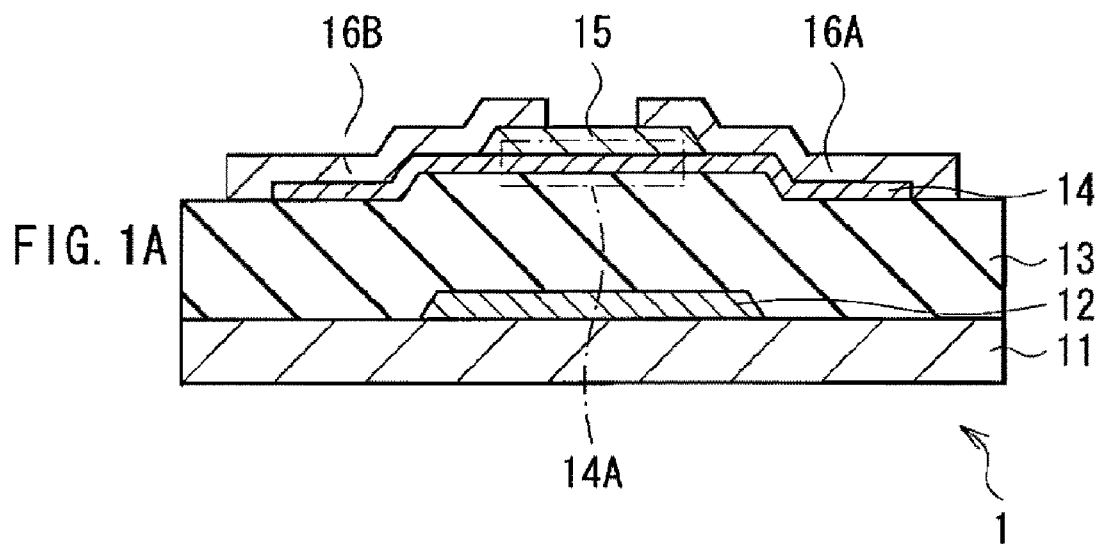
FIGS. 1A and 1B express a sectional structure of a thin film transistor according to an embodiment of the present invention.
Figure 1B:
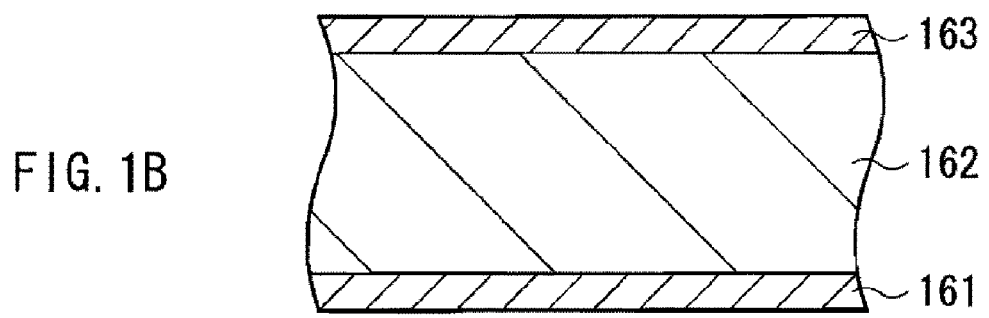

FIG. 1A illustrates a sectional structure of a thin film transistor 1 according to an embodiment of the present invention. FIG. 1B is a diagram for explaining a layer structure of a source electrode 16A and a drain electrode 16B illustrated in FIG. 1A. The thin film transistor 1 functions, for example, as a drive element for performing display driving of a liquid crystal display, an organic EL (Electro Luminescence) display, or the like and has, for example, a bottom-gate structure (inverted staggered structure).

The thin film transistor 1 has a gate electrode 12 in a selective region on a substrate 11 made of glass, plastic or the like, and a gate insulating film 13 is formed so as to cover the gate electrode 12 and the substrate 11. An oxide semiconductor film 14 is provided on the gate insulating film 13, and a channel 14A is formed in a region corresponding to the gate electrode 12, in the oxide semiconductor film 14. A channel protection film 15 is provided immediately on the channel 14A formed in the oxide semiconductor film 14. The source electrode 16A and the drain electrode 16B are disposed in a predetermined pattern so as to cover the oxide semiconductor film 14 exposed from the channel protection film 15.

The gate electrode 12 is an electrode for applying gate voltage to the thin film transistor 1. The gate electrode 12 is made of, for example, molybdenum (Mo) or the like.

The gate insulating film 13 is constructed by a silicon oxide film, a silicon nitride film, a silicon nitride-oxide film, an aluminum oxide film, or the like.

The oxide semiconductor film 14 is constructed by using oxide semiconductor as a main component, and the channel 14A for generating current between the source electrode 16A and the drain electrode 16B is formed. Examples of the oxide semiconductor are zinc oxide, In—M—Zn—O (M is at least one of gallium, aluminum, and iron), and the like.

The channel protection film 15 plays the role of preventing damage on the channel 14A in the oxide semiconductor film 14 and preventing invasion of hydrogen or the like into the oxide semiconductor film 14. The channel protection film 15 also plays the role of protecting the channel 14A from a resist peeling solution or the like used at the time of forming the source electrode 16A and the drain electrode 16B. Such a channel protection film 15 is, for example, a silicon nitride film, a silicon oxide film, or the like.

Any of the source electrode 16A and the drain electrode 16B is constructed by a multilayer film made of a plurality of metal layers. For example, as shown in FIG. 1B, it has a structure in which three layers of the first, second, and third metal layers 161, 162, and 163 are stacked. The first metal layer 161 is formed along the interface with the oxide semiconductor film 14, and the second and third metal layers 162 and 163 are formed in order on the first metal layer 161.

The first metal layer 161 is made of, for example, a metal or alloy having ionization energy equal to or larger than that of molybdenum and has a thickness of, for example, 30 nm to 50 nm. The ionization energy is so-called first ionization energy, and the ionization energy of molybdenum is about 684 KJ/mol. An example of the metal of the first metal layer 161 is molybdenum, mercury (Hg), silver (Ag), platinum (Pt), gold (Au), or the like. The first metal layer 161 may be formed on the entire surface of the substrate 11. However, it is sufficient to form the first metal layer 161 so as to cover at least the surface and side faces of the oxide semiconductor film 14 exposed from the channel protection film 15.

The second metal layer 162 is made of a metal material having low electric resistance and excellent electrical conductivity, concretely, aluminum (Al), copper (Cu), or the like, and has a thickness of, for example, 300 nm to 1000 nm.

The third metal layer 163 is disposed to protect the surface of the second metal layer 162, is made of titanium or the like, and has a thickness of, for example, 30 nm to 50 nm. In the source electrode 16A and the drain electrode 16B, the third metal layer 163 may not be formed. That is, a two-layer structure of the first and second metal layers 161 and 162 may be employed.

Method of Manufacturing Thin Film Transistor

Figure 2A:
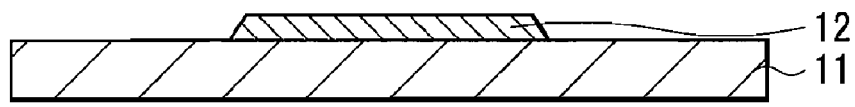
FIGS. 2A to 2D are diagrams illustrating a method of manufacturing the thin film transistor shown in FIGS. 1A and 1B in process order.

The thin film transistor 1 may be manufactured, for example, as follows. First, as shown in FIG. 2A, a metal thin film is formed on the entire surface of the substrate 11 by sputtering or vapor deposition. After that, the metal thin film is patterned by using, for example, photolithography to form the gate electrode 12.

Figure 2B:
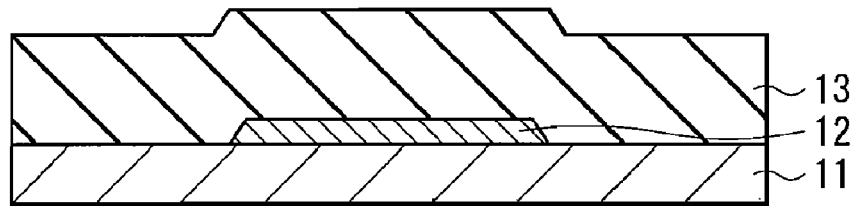

Subsequently, as shown in FIG. 2B, the gate insulating film 13 is formed so as to cover the substrate 11 and the gate electrode 12 by, for example, plasma CVD (Chemical Vapor Deposition).

Figure 2C:
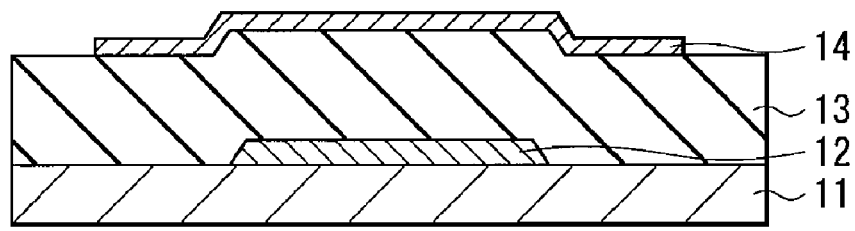

As shown in FIG. 2C, the oxide semiconductor film 14 made of the above-described material and having the above-described thickness is formed by using, for example, sputtering. In the case of using indium gallium zinc oxide (IGZO) as the oxide semiconductor, using DC sputtering targeting a ceramic of IGZO and plasma discharge using a mixture gas of argon (Ar) and oxygen ($O_2$), the oxide semiconductor film 14 is formed. Preferably, before the plasma discharge is performed, air is exhausted until the degree of vacuum in a vacuum vessel becomes, for example, $1 \times 10^{-4}$ Pa or less, and a mixture gas of argon and oxygen is introduced. After that, the formed oxide semiconductor film 14 is patterned by using, for example, photolithography.

Figure 2D:
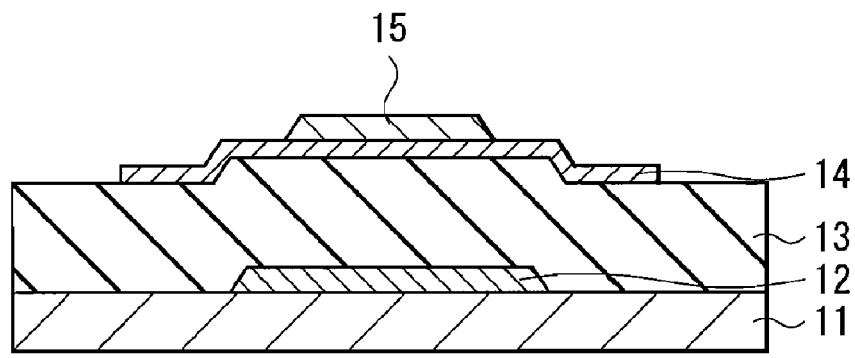

Subsequently, as shown in FIG. 2D, the channel protection film 15 made of the above-described material is formed by, for example, sputtering. After that, by using, for example, photolithography, the channel protection film 15 is patterned so as to be formed in correspondence with the channel 14A.

Next, the source electrode 16A and the drain electrode 16B are formed on the oxide semiconductor film 14. At this time, the first metal layer 161 is formed by using, for example, sputtering so as to cover the region in which the oxide semiconductor film 14 and the channel protection film 15 are formed. After that, the second and third metal layers 162 and 163 are formed in order on the first metal layer 161. Subsequently, the first, second, and third metal layers 161, 162, and 163 are patterned by using, for example, photolithography, thereby forming the source electrode 16A and the drain electrode 16B.

Finally, anneal process is performed on the substrate 11 on which the source electrode 16A and the drain electrode 16B in oxygen atmosphere. By the process, loss of oxygen in the oxide semiconductor film 14 is prevented, and excellent electric characteristics are assured more easily. In such a manner, the thin film transistor 1 shown in FIG. 1A is completed.

Action and Effect of Thin Film Transistor

In the thin film transistor 1 of the embodiment, when a voltage (gate voltage Vg) equal to or higher than the predetermined threshold voltage is applied to the gate electrode 12 via a not-shown wiring layer, the channel 14A is formed in the oxide semiconductor film 14, current (drain current Id) flows between the source electrode 16A and the drain electrode 16B, and the thin film transistor 1 functions as a transistor.

In the embodiment, on the oxide semiconductor film 14 in which the channel 14A is formed, the source electrode 16A and the drain electrode 16B are formed. Each of the source electrode 16A and the drain electrode 16B is obtained by stacking the first, second, and third metal layers 161, 162, and 163 from the side of the oxide semiconductor film 14, and the first metal layer 161 is made of a metal having ionization energy equal to or higher than that of molybdenum. That is, the first metal layer 161 in contact with the oxide semiconductor film 14 is made of a metal which is not susceptible to oxidation.

On the contrary, in the case where the metal layer in contact with the oxide semiconductor film 14 is made of a metal having ionization energy smaller than that of molybdenum, that is, susceptible to oxidation, oxygen in the oxide semiconductor film 14 is taken to the side of the metal layer with oxidation of the metal layer. Consequently, the oxygen is desorbed to the outside of the oxide semiconductor film 14. Due to loss of oxygen, carriers are generated in the oxide semiconductor layer 14.

Therefore, since the first metal layer 161 in contact with the oxide semiconductor film 14 is made of a metal which is not susceptible to oxidation like in the embodiment, as compared with the case where the first metal layer 161 is made of a metal susceptible to oxidation, oxygen is not easily taken to the first metal layer 161. Consequently, desorption of oxygen from the oxide semiconductor film 14 is suppressed, and generation of carries due to loss of oxygen is suppressed in the oxide semiconductor film 14.

As described above, in the thin film transistor 1, the source electrode 16A and the drain electrode 16B in contact with the oxide semiconductor film 14 has the stack-layer structure, and the first metal layer 161 in contact with the oxide semiconductor film 14 is made of a metal having ionization energy equal to or higher than that of molybdenum. Therefore, in the oxide semiconductor film 14, generation of carriers due to loss of oxygen may be suppressed. It may suppress deterioration in the electric characteristics and improve reliability.

In the embodiment, in the source electrode 16A and the drain electrode 16B, the second metal layer 162 is provided on the first metal layer 161, and the second metal layer 162 is made of a metal having high conductivity. With the configuration, as compared with the case where the source electrode 16A and the drain electrode 16B are constructed by a single layer of the first metal layer 161, electric resistance may be reduced, and the functions of the source and drain and the wiring may be improved.

Particularly, in the case where the first metal layer 161 is made of molybdenum, only the surface (the surface on the oxide semiconductor film 14 side) of the first metal layer 161 is oxidized, and an oxide layer is formed. In this case, the formed oxide layer functions as an oxygen barrier layer, and exhaust of oxygen from the oxide semiconductor film 14 is suppressed. Therefore, in the case of making the first metal layer 161 of molybdenum, molybdenum itself is a metal which is not susceptible to oxidation and, in addition, by the oxygen barrier function of the oxide layer, loss of oxygen in the oxide semiconductor film 14 is effectively suppressed. Since the amount of oxygen taken to the side of the first metal layer 161 for oxidation of the surface is very small, the electric characteristics of the thin film transistor are sufficiently maintained.

Configuration of Display Device

Figure 3:
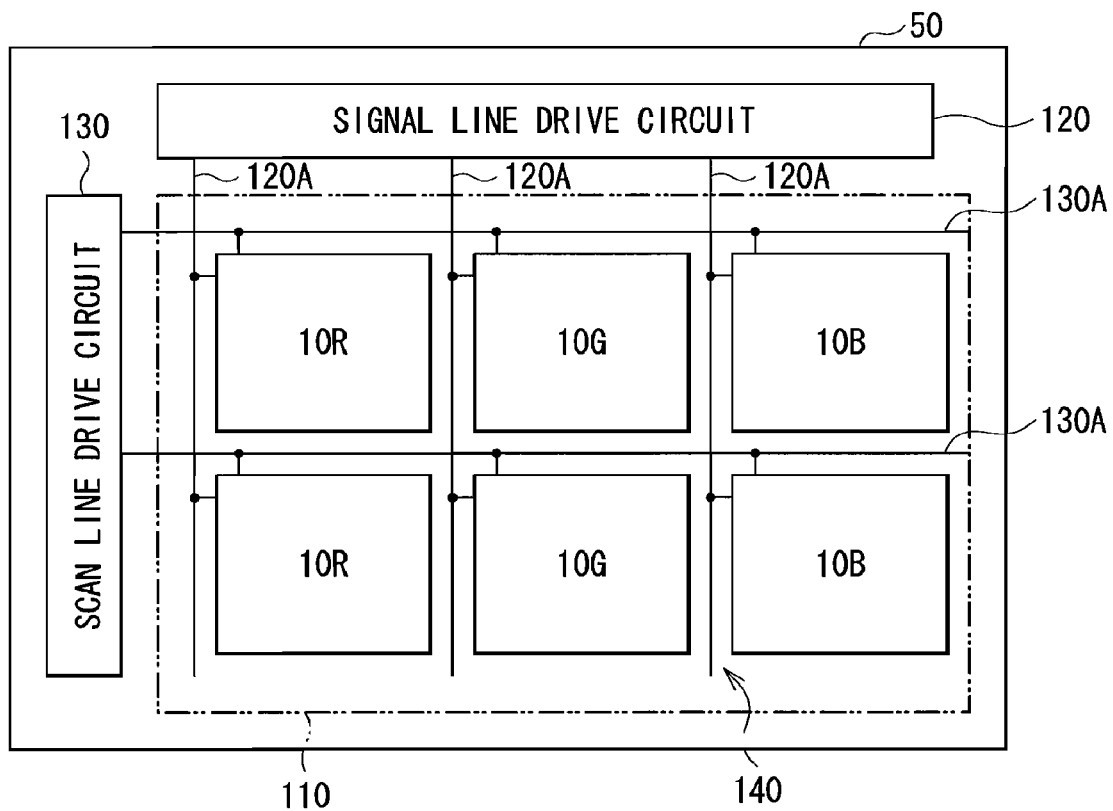
FIG. 3 is a diagram illustrating a circuit configuration of a display device using the thin film transistor shown in FIGS. 1A and 1B.

FIG. 3 illustrates a circuit configuration of a display device (display device 40) using the thin film transistor 1 as a drive device. The display device 40 is, for example, a liquid crystal display or an organic EL display. For example, on a drive panel 50, a plurality of picture elements 10R, 10G, and 10B disposed in a matrix and drive circuits for driving the picture elements 10R, 10G, and 10B are formed. The picture elements 10R, 10G, and 10B are liquid crystal display elements, organic EL elements, or the like for emitting color light of red (R), green (G), and blue (B). Neighboring three picture elements 10R, 10G, and 10B construct one pixel, and a display region 110 is formed by a plurality of pixels. As drive circuits, for example, a signal line drive circuit 120 and a scan line drive circuit 130 as drivers for video display, and a pixel drive circuit 140 are disposed on the drive panel 50. A not-shown sealing panel is adhered to the drive panel 50. By the sealing panel, the picture elements 10R, 10G, and 10B and the drive circuits are sealed.

Figure 4:
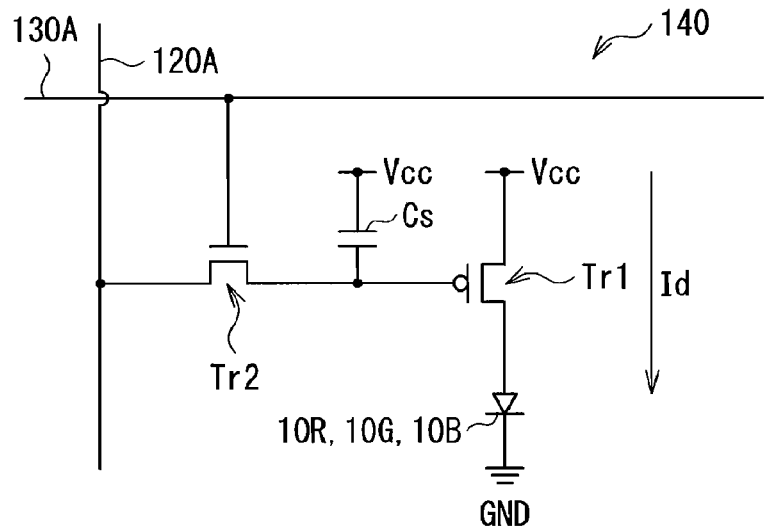
FIG. 4 is an equivalent circuit diagram illustrating an example of a pixel drive circuit shown in FIG. 3.

FIG. 4 is an equivalent circuit diagram of the pixel drive circuit 140. The pixel drive circuit 140 is an active-type drive circuit in which transistors Tr1 and Tr2 are disposed as the thin film transistors 1. A capacitor Cs is provided between the transistors Tr1 and Tr2, and the picture element 10R (or the picture element 10G or 10B) is connected in series with the transistor Tr1 between a first power supply line (Vcc) and a second power supply line (GND). In such a pixel drive circuit 140, a plurality of signal lines 120A are disposed in the column direction, and a plurality of scan lines 130A are disposed in the row direction. Each of the signal lines 120A is connected to the signal line drive circuit 120, and an image signal is supplied from the signal line drive circuit 120 to the source electrode of the transistor Tr2 via the signal line 120A. Each of the scan lines 130A is connected to the scan line drive circuit 130, and a scan signal is sequentially supplied from the scan line drive circuit 130 to the gate electrode of the transistor Tr2 via the scan line 130A.

EXAMPLE

As an example of the foregoing embodiment, the thin film transistor 1 using molybdenum (50 nm thick) for the first metal layer 161, aluminum (500 nm thick) for the second metal layer 162, and titanium (50 nm thick) for the third metal layer 163 was produced. Molybdenum was used for the gate electrode 12, silicon oxide (SiO) with film thickness 200 nm was used for the gate insulating film 13, In—Ga—Zn—O was used for the oxide semiconductor film 14, and silicon oxide (SiO) with film thickness 200 nm was used for the channel protection film 15. As conditions of annealing process performed after formation of the source electrode 16A and the drain electrode 16B, oxygen concentration in an atmosphere including oxygen ($O_2$) and nitrogen ($N_2$) was set to about 40%, heat treatment temperature was set to 300° C., and treatment time was set to two hours.

Figure 5:
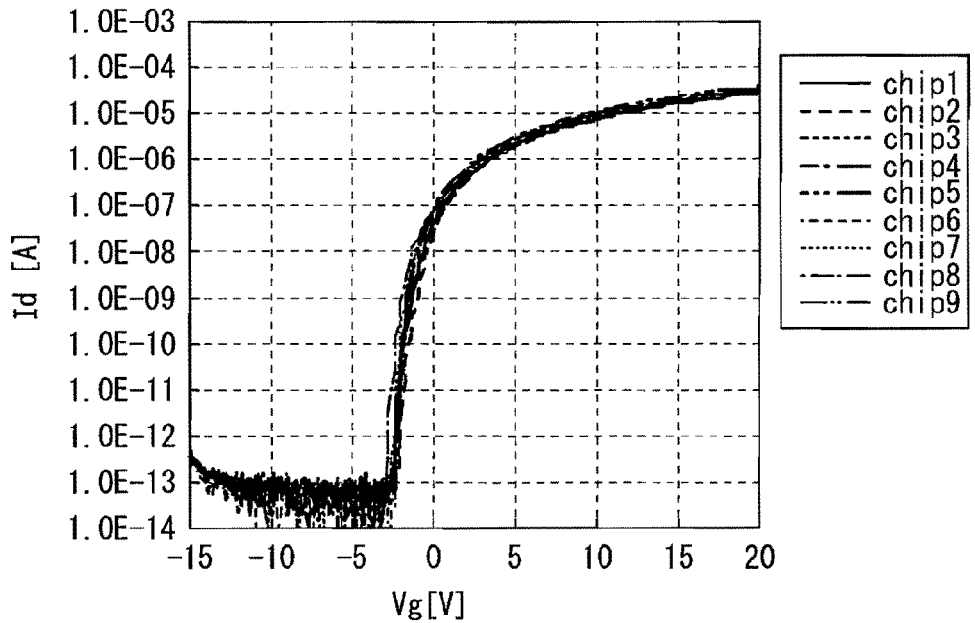
FIG. 5 is a diagram illustrating a Vg-Id characteristic immediately after annealing in the embodiment.
Figure 6:
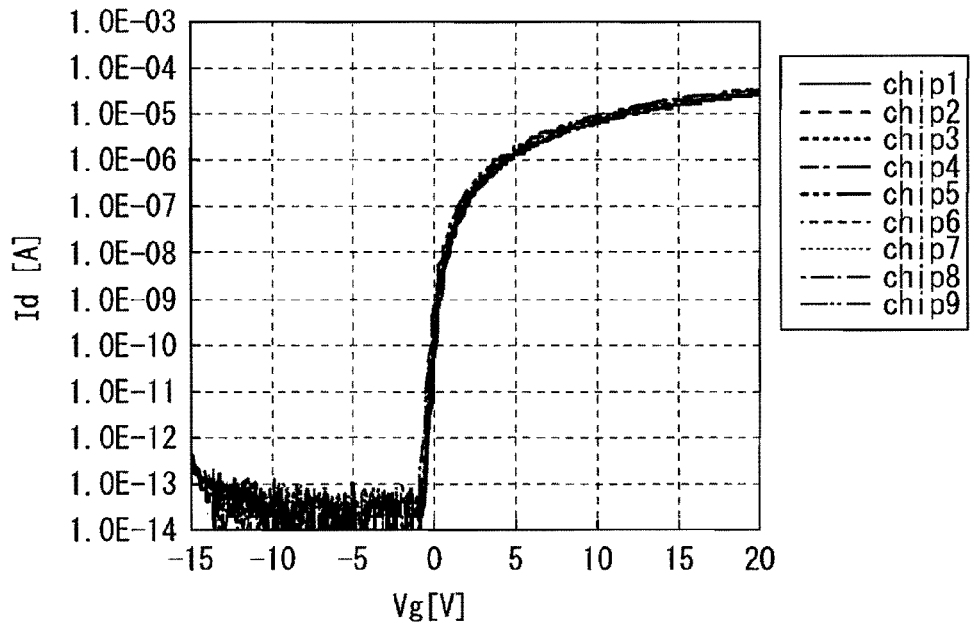
FIG. 6 is a diagram illustrating a Vg-Id characteristic after lapse of four days since the annealing in the embodiment.
Figure 7:
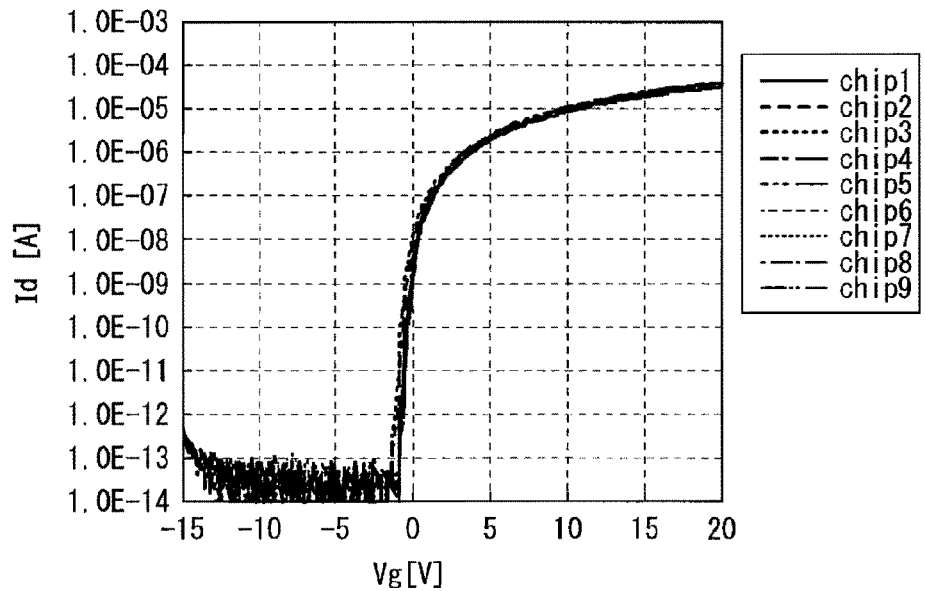
FIG. 7 is a diagram illustrating a Vg-Id characteristic after lapse of seven days since the annealing in the embodiment.

To examine changes in the electric characteristics with time of such a thin film transistor 1, changes in drain current Id (A) with respect to the gate voltage Vg (V) (hereinbelow, called Vg-Id characteristics) immediately after the annealing process, four days after the annealing process, and seven days after the annealing process were measured. The results were shown in FIGS. 5 to 7. FIGS. 5 to 7 illustrate the results of nine thin film transistors 1 (chip 1 to chip 9) produced under similar conditions.

Figure 8A:
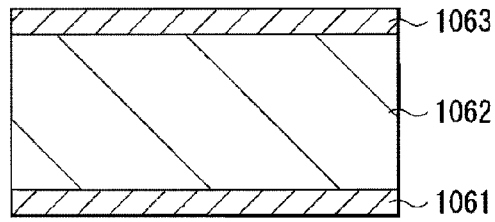
FIGS. 8A and 8B are diagrams illustrating a stack-layer structure of a source electrode and a drain electrode of comparative examples 1 and 2.
Figure 8B:
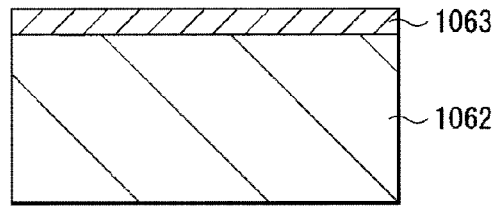

As comparative examples 1 and 2 of the example, thin film transistors each using a metal having ionization energy smaller than that of molybdenum for a metal layer which is in contact with the oxide semiconductor film 14 as the source electrode and the drain electrode were produced. In the comparative example 1, as shown in FIG. 8A, a three-layer structure is employed in which a titanium layer 1061 (50 nm thick), an aluminum layer 1062 (500 nm thick), and a titanium layer 1063 (50 nm thick) are stacked in order from the side of the oxide semiconductor film 14. On the other hand, in the comparative example 2, a two-layer structure is employed in which the aluminum layer 1062 (500 nm thick) and the titanium layer 1063 (50 nm thick) are stacked in order from the side of the oxide semiconductor film 14. That is, the metal layer which is in contact with the oxide semiconductor film 14 is made of titanium in the comparative example 1 and is made of aluminum in the comparative example 2 (ionization energy of titanium>ionization energy of aluminum). The configuration other than the source electrode and the drain electrode having such a stack-layer structure is similar to that of the example.

Figure 9:
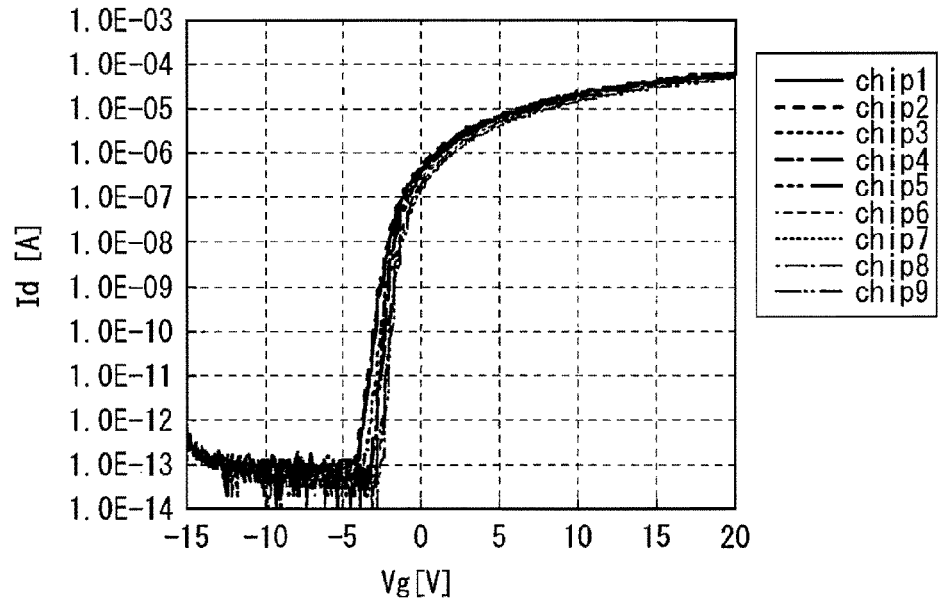
FIG. 9 is a diagram illustrating a Vg-Id characteristic immediately after annealing in the comparative example 1.
Figure 10:
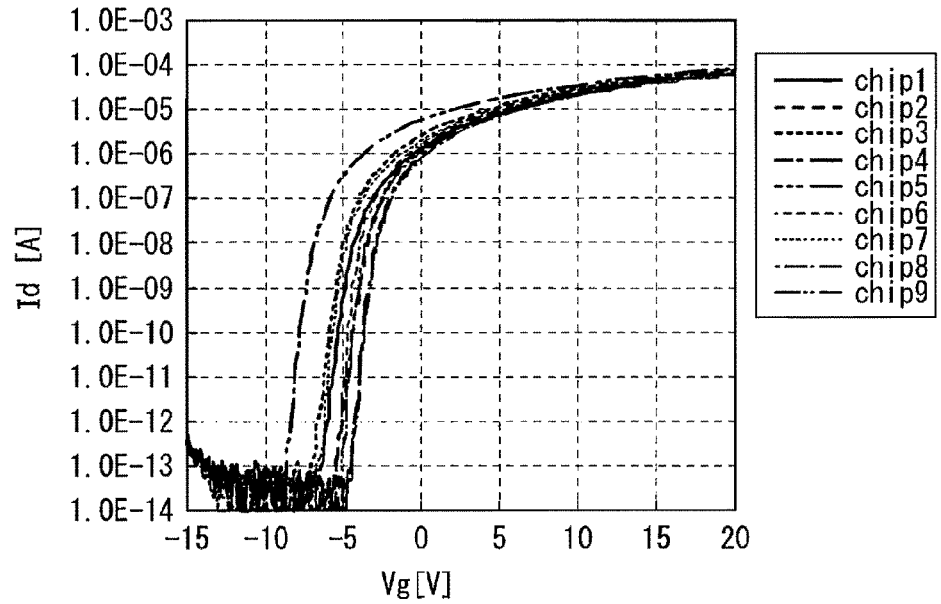
FIG. 10 is a diagram illustrating a Vg-Id characteristic after lapse of four days since the annealing in the comparative example 1.
Figure 11:
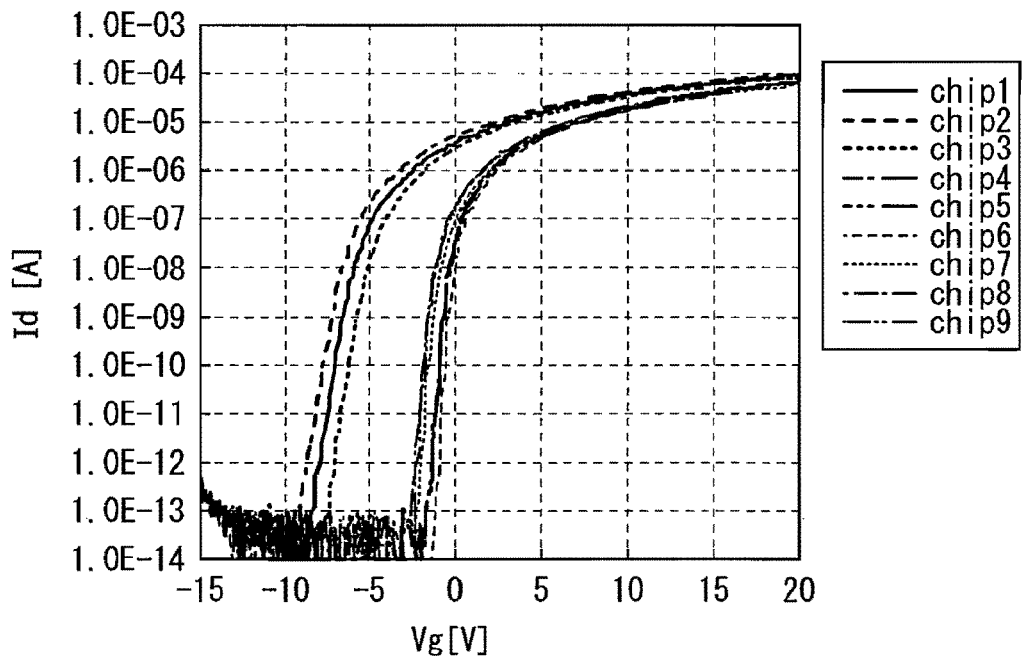
FIG. 11 is a diagram illustrating a Vg-Id characteristic after lapse of seven days since the annealing in the comparative example 1.
Figure 12:
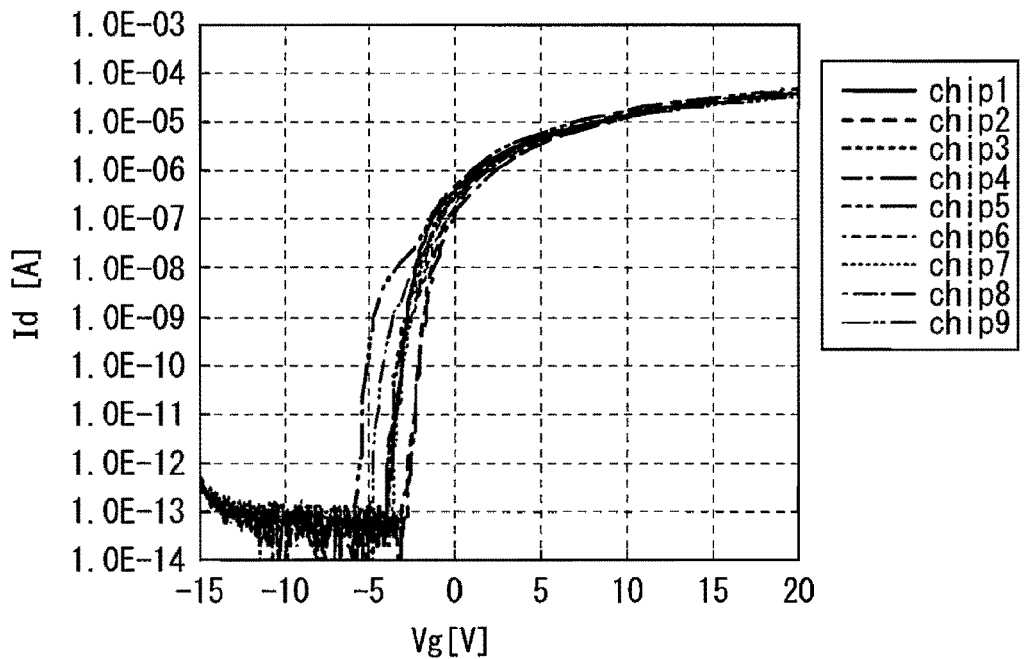
FIG. 12 is a diagram illustrating a Vg-Id characteristic immediately after annealing in the comparative example 2.
Figure 13:
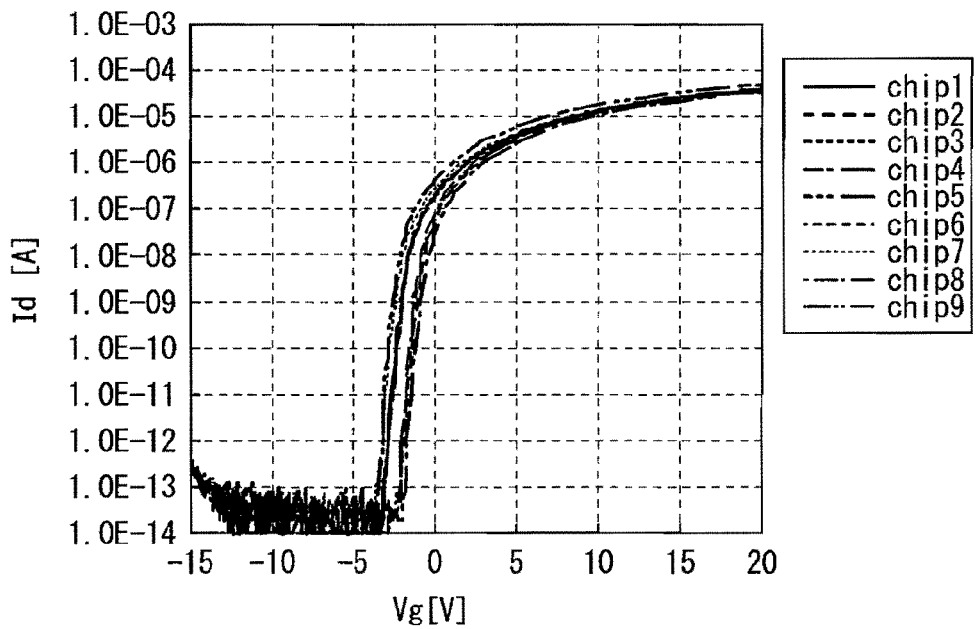
FIG. 13 is a diagram illustrating a Vg-Id characteristic after lapse of four days since the annealing in the comparative example 2.
Figure 14:
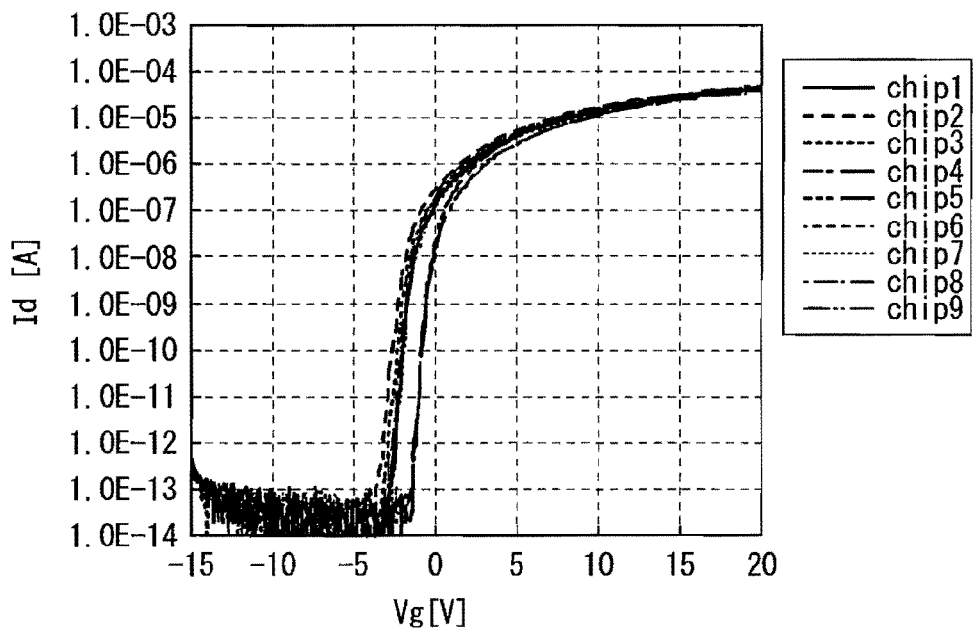
FIG. 14 is a diagram illustrating a Vg-Id characteristic after lapse of seven days since the annealing in the comparative example 2.

With respect to the thin film transistors of the comparative examples 1 and 2, in a manner similar to the example, changes in the drain current Id(A) relative to the gate voltage Vg (V) at some time points after the annealing process were measured. The result of the comparative example 1 is shown in FIGS. 9 to 11. The result of the comparative example 2 is shown in FIGS. 12 to 14.

As shown in FIGS. 9 to 11, in the comparative example 1 in which the titanium layer 1061 is formed in contact with the oxide semiconductor film 14, the Vg-Id characteristic deteriorates with time from a time immediately after the annealing process to a time after lapse of seven days, and variations occurred among chips 1 to 9. As shown in FIGS. 12 to 14, in the comparative example 2 in which the aluminum layer 1062 is formed in contact with the oxide semiconductor film 14, deterioration with time which is as large as that of the comparative example 1 is not seen in the Vg-Id characteristic, but variations occurred among chips 1 to 9. Therefore, in the thin film transistors of the comparative examples 1 and 2, the electric characteristics tend to deteriorate at a stage before the thin film transistors are mounted on a panel of a display or the like.

In contrast, in the example in which the first metal layer 161 in contact with the oxide semiconductor film 14 is made of molybdenum as shown in FIGS. 5 to 7, the Vg-Id characteristic is held almost constant for a period from a time immediately after the annealing process to a time after lapse of seven days, and fluctuations with time are extremely small. The Vg-Id characteristics of chips 1 to 9 also hardly vary.

From the above results, it is known that by making the metal layer in contact with the oxide semiconductor film 14 of a metal having ionization energy equal to or higher than that of molybdenum, that is, a metal which is not susceptible to oxidation, deterioration in the electric characteristic may be suppressed.

Modification

A thin film transistor according to a modification of the present invention will now be described. The thin film transistor of the modification is similar to the thin film transistor 1 of the foregoing embodiment except for the material of the metal layer (hereinbelow, simply called a first metal layer) which is in contact with the oxide semiconductor film 14, in the stack-layer structure constructing the source electrode and the drain electrode. Consequently, the thin film transistor of the modification is not illustrated, the same reference numerals as those of the thin film transistor 1 of the embodiment are used for components, and repetitive description will not be given.

The first metal layer of the modification is made of a metal material having oxygen barrier property, concretely, a nitride or silicon nitride of any of the following metals. Examples of the metal used for the first metal layer include tantalum (Ta), vanadium (V), titanium (Ti), zirconium (Zr), tungsten (W), copper (Cu), aluminum (Al), ruthenium (Ru), iridium (Ir), nickel (Ni), cobalt (Co), and platinum (Pt).

The first metal layer which is in contact with the oxide semiconductor film 14 is not limited to a metal having predetermined ionization energy as described in the foregoing embodiment but may be made of a nitride or silicon nitride of a metal having oxygen barrier property. In this case, by the oxygen barrier function of the first metal layer, desorption from the oxide semiconductor film 14 to the outside is suppressed. Therefore, generation of carriers due to loss of oxygen in the oxide semiconductor film 14 may be suppressed, and an effect similar to that of the foregoing embodiment may be obtained.

Although the present invention has been described above by the embodiment and the modification, the invention is not limited to the foregoing embodiment and the like but may be variously modified. For example, in the embodiment and the like, the source electrode and the drain electrode have the stack-layer structure of the first, second, and third metal layers. The number of layers is not limited to three but may be two or four or more. Also in the case where the number of layers is two or four or more, if the metal layer which is in contact with the oxide semiconductor film is made of a metal having predetermined ionization energy or a metal having oxygen barrier property, an effect equivalent to that of the present invention may be obtained.

Although the thin film transistor having the bottom gate structure has been described as an example in the embodiment and the like, the invention is not limited to the bottom gate structure. A top gate structure may be also employed.

The present application contains subject matter related to that disclosed in Japanese Priority Patent Application JP 2008-293043 filed in the Japan Patent Office on Nov. 17, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor comprising:
a substrate;
a gate insulating layer on the substrate;
a gate electrode between the substrate and the gate insulating layer;
an oxide semiconductor film on the gate insulating film, the oxide semiconductor film capable of having a channel formed therein;
a channel protection film formed on a portion of the oxide semiconductor film; and
a pair of electrodes formed as a source electrode and a drain electrode which are in part in contact with the oxide semiconductor film but in part spaced from the oxide semiconductor film due to the channel protection film, the electrodes comprising at least first and second metal layers stacked in that order proceeding from the oxide semiconductor film,
wherein,
the first metal layer is made of a metal having an ionization energy equal to or higher than that of molybdenum (Mo).

2. The thin film transistor according to claim 1, wherein the first metal layer is made of molybdenum.

3. The thin film transistor according to claim 2, wherein each of the pair of electrodes is obtained by further stacking a third metal layer on the second metal layer.

4. The thin film transistor according to claim 3, wherein the second metal layer is made of aluminum (Al), and the third metal layer is made of titanium (Ti).

5. The thin film transistor according to claim 1, further comprising a protection film on the channel of the oxide semiconductor film.

6. The thin film transistor of claim 1, wherein the first metal is selected from the group consisting of mercury, silver, platinum and gold.

7. A display device comprising a display element and a thin film transistor for driving the display element,
wherein the thin film transistor includes:
a substrate;
a gate insulating layer on the substrate;
a gate electrode between the substrate and the gate insulating layer;
an oxide semiconductor film on the gate insulating film, the oxide semiconductor film capable of having a channel formed therein;
a channel protection film formed on a portion of the oxide semiconductor film; and
a pair of electrodes formed as a source electrode and a drain electrode which are in part in contact with the oxide semiconductor film but in part spaced from the oxide semiconductor film due to the channel protection film, the electrodes comprising at least first and second metal layers stacked in that order proceeding from the oxide semiconductor film, the first metal layer being made of a metal having (a) an ionization energy equal to or higher than that of molybdenum (Mo).

8. The display device of claim 7, wherein the first metal is selected from the group consisting of mercury, silver, platinum and gold.

9. The display device of claim 7, wherein the first metal is molybdenum.

* * * * *